United States Patent
Wang et al.

(10) Patent No.: US 8,659,039 B2
(45) Date of Patent: Feb. 25, 2014

(54) SEMICONDUCTOR LIGHT EMITTING DIODE

(75) Inventors: Xuelun Wang, Ibaraki (JP); Mutsuo Ogura, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/146,179

(22) PCT Filed: Feb. 8, 2010

(86) PCT No.: PCT/JP2010/051813
§ 371 (c)(1),
(2), (4) Date: Aug. 25, 2011

(87) PCT Pub. No.: WO2010/095531
PCT Pub. Date: Aug. 26, 2010

(65) Prior Publication Data
US 2011/0297955 A1     Dec. 8, 2011

(30) Foreign Application Priority Data

Feb. 18, 2009    (JP) ................................. 2009-034712
Jun. 12, 2009    (JP) ................................. 2009-140684

(51) Int. Cl.
*H01L 33/02*     (2010.01)
(52) U.S. Cl.
USPC ............. 257/95; 257/79; 257/94; 257/96; 257/103; 257/E33.023; 257/E33.006
(58) Field of Classification Search
USPC .......... 257/98, 79, 86, 103, E33.06, E33.023, 257/13, 76, 80, 85, 90, 91, 94
See application file for complete search history.

(56) References Cited

U.S. PATENT DOCUMENTS

2003/0168666 A1*   9/2003   Okuyama et al. ............... 257/80
2004/0264192 A1    12/2004   Nagata et al.
(Continued)

FOREIGN PATENT DOCUMENTS

JP     2008-098486 A     4/2008

OTHER PUBLICATIONS

Haynes, W. The handbook of chemistry and physics. 93rd. Boca Raton, FL: CRC Press, 2012. 12-80-12-93. Print.*
Haynes, W. The handbook of chemistry and physics. 93rd. Boca Raton, FL: CRC Press, 2012. 10-240-10-243. Print.*

(Continued)

*Primary Examiner* — Lynne Gurley
*Assistant Examiner* — Lauren R Bell
(74) *Attorney, Agent, or Firm* — Howson & Howson LLP

(57) ABSTRACT

A highly-efficient semiconductor light emitting diode with improved light extraction efficiency comprising at least a substrate having a plurality of crystal planes, a first conductivity-type barrier layer, an active layer serving as a light emitting layer and a second conductivity-type barrier layer stacked on the substrate. The semiconductor light emitting diode comprises a ridge structure configured from one flat surface and at least two inclining surfaces in the in-plane direction. The width (W) of the flat surface of the ridge structure is 2λ (λ: light emission wavelength) or less. The active layer is positioned in the laminating direction so that the shortest length (L) between two points is λ (light emission wavelength) or less, wherewith the first point is the shortest point where the light emitted from the center (C) of the active layer begins total internal reflection at the interface between the inclining surfaces of the ridge structure and air, and the second point is a point where the flat surface begins.

20 Claims, 8 Drawing Sheets

(56) References Cited

U.S. PATENT DOCUMENTS

| | | | |
|---|---|---|---|
| 2005/0001227 A1* | 1/2005 | Niki et al. | 257/98 |
| 2005/0200794 A1* | 9/2005 | Oohata | 349/141 |
| 2007/0200135 A1* | 8/2007 | Wang | 257/103 |
| 2008/0173887 A1 | 7/2008 | Baba et al. | |
| 2008/0258166 A1 | 10/2008 | Sakai et al. | |
| 2008/0308832 A1* | 12/2008 | Hsieh et al. | 257/98 |
| 2010/0001292 A1 | 1/2010 | Yamasaki et al. | |

OTHER PUBLICATIONS

One Page Abstract of: M.R. Krames et al., "High Power Truncated-Inverted-Pyramid (AlxGa1-x)0.5In0.5P/GaP Light-Emitting Diodes Exhibiting >50% External Quantum Efficiency", Applied Physics Letters, vol. 75, Issue 16, 1999.

One Page Abstract of: H. Weman et al., "Selective Carrier Injection into V-groove Quantum", Applied Physics Letters, vol. 73, Issue 12, 1998.

* cited by examiner

SEMICONDUCTOR LIGHT EMITTING DIODE

TECHNICAL FIELD

The present invention relates to a highly-efficient light emitting diode that uses a semiconductor, in particular a compound semiconductor, as its material, and particularly relates to a semiconductor light emitting diode with improved light extraction efficiency by utilizing the interference phenomenon of evanescent wave on a non-planar substrate.

BACKGROUND ART

A light emitting diode (LED) that uses such a compound semiconductor as AlGaAs, AlGaInP and AlGaInN as its material is expected to become the energy-saving, long-life illumination/display light source to take over the existing lighting equipment such as incandescent bulbs and fluorescent lamps, and research and development for its widespread use are being strategically promoted around the world.

The energy conversion efficiency of a light emitting diode is generally decided based on the product of internal quantum efficiency and efficiency of extracting light from semiconductor to the outside, i.e., light extraction efficiency. The internal quantum efficiency has seen dramatic improvement based on the advancement of crystal growth technology in recent years. For example, a red LED made of an AlGaInP-based material having a light emission wavelength of approximately 650 nm with an internal quantum efficiency of nearly 100% has already been put into practical application.

Moreover, a device of an InGaN-based blue LED with internal quantum efficiency of 70% to 80% has also been reported. Meanwhile, it is extremely difficult to efficiently extract light (spontaneous emission) generated within the semiconductor to the outside (into the air), and it would not be an overstatement to say that this is the biggest factor which is inhibiting the improvement in the luminous efficiency of LEDs.

There are three primary factors in the foregoing problem. Specifically, 1) total internal reflection of light at the semiconductor/air interface caused by the high refractive index of the semiconductor material, 2) shielding of light by the Ohmic electrode, and 3) absorption of light by the absorptive substrate. For example, in the case of a flat substrate device, due to the total internal reflection at the interface, the light that can be extracted outside is light that enters the interface at an angle that is smaller than the critical angle of the total internal reflection, and the amount of such light is generally only several percent (2 to 4%) of the light that was generated in the active layer.

In order to improve the light extraction efficiency of LEDs, various technologies have been developed to date. For example, as technologies for suppressing the total internal reflection at the interface, there are, for example, the methods of (1) encapsulating the LED chip with resin having a higher refractive index than air, (2) using a mechanical method to process the crystals into a special shape such as an inverted pyramid (refer to Non-Patent Document 1), (3) controlling the irradiation mode of the light with microcavities or a photonic crystal structure (refer to Patent Document 1), and (4) forming a metal mirror with a high reflectance on one side of a thin film crystal serving as the main body of the light emitting diode that is separated from the substrate and intentionally forming microasperities on the other side, and subsequently utilizing the modulation effect of the angle of reflection of the microasperities and the multiple reflection at the interface between the metal mirror and air to increase the ratio of light that enters the air interface at an angle that is smaller than the critical angle of the total internal reflection. But, even using these technologies does not make it easy to obtain a light extraction efficiency that exceeds 50%.

In addition, the special geometry shaping of crystals based on the mechanical method and the production of microcavities or a photonic crystal structure entail problems such as (1) the production process being complex and expensive, and (2) not being suitable for large area (high power) devices. In particular, regarding the production cost, it is absolutely imperative for the production cost of LEDs to be lowered by one digit or more than the current production cost to realize the widespread use of LEDs as a solid-state illumination device. Accordingly, the development of light extraction technology in which the production process is simple and capable of easily achieving a light extraction efficiency of 50% or higher is being strongly demanded.

The present inventors have developed a new type of light emitting diode in which the current injection area and the light emitting area (crystal plane with low band gap energy) are separated spatially by selectively forming a metal electrode for current injection on a crystal plane with a high band gap energy by utilizing the behavior in which the band gap energy of the semiconductor epitaxial layer grown on the non-planar substrate having a plurality of crystal planes depends on the crystal plane orientation (refer to Patent Document 2).

In this device, since the carrier injected from the crystal plane with a high band gap energy emits light after moving to a crystal plane with a low band gap to energy, it was possible to considerably inhibit the shielding of light by the electrode. In the demonstration experiment using a GaAs/AlGaAs-based material, a light extraction efficiency of approximately 15% (no resin encapsulation) was obtained using a process that is simpler than the conventional technologies. However, this technology hardly showed any effect against the problem of the absorption of light by the absorptive substrate, and the effect against the total internal reflection at the interface was also insufficient.

[Patent Document 1] Japanese published unexamined Application No. 2008-311687
[Patent Document 2] Japanese published unexamined Application No. 2007-214558
[Non-Patent Document 1] M. R. Krames, M. Ochiai-Holcomb, G. E. Hofler, C. Carter-Coman, E. I. Chen, I.-H. Tan, P. Grillot, N. F. Gardner, H. C. Chui, J.-W. Huang, S. A. Stockman, F. A. Kish, T. S. Tan, C. P. Kocot, M. Hueschen, J. Posselt, B. Loh, G. Sasser, and D. Collins, "High-power truncated-inverted-pyramid $(Al_xGa_{1-x})_{0.5}In_{0.5}P/GaP$ light emitting diodes exhibiting >50% external quantum efficiency", Applied Physics Letters, Vol. 75 (1999) 2365-2367.
[Non-Patent Document 2] H. Weman, E. Martinet, A. Rudra, and E. Kapon, "Selective Carrier Injection into V-groove Quantum Wires", Applied Physics Letters, Vol. 16 (1998) 2959-2961.

DISCLOSURE OF THE INVENTION

The present inventors discovered a phenomenon where evanescent wave that is generated on two different crystal planes during total internal reflection in a semiconductor microstructure grown on a non-planar substrate having a plurality of crystal planes interferes with each other on a third crystal plane of a size that is smaller than $2\lambda$ ($\lambda$: light emission wavelength) and is irradiated outward at an extremely high efficiency. Thus, an object of this invention is to leverage the foregoing phenomenon and provide a semiconductor light emitting diode with high light extraction efficiency.

In light of the above, the present invention provides:

1. A semiconductor light emitting diode comprising at least a substrate having a plurality of crystal planes, a first conductivity-type barrier layer, an active layer serving as a light emitting layer and a second conductivity-type barrier layer stacked on the substrate, wherein the semiconductor light emitting diode comprises a ridge structure configured from one flat surface and at least two inclining surfaces in an in-plane direction, a width (W) of a flat surface of the ridge structure is $2\lambda$ ($\lambda$: light emission wavelength) or less, and the active layer is positioned in a laminating direction so that a shortest length (L) between two points is $\lambda$ (light emission wavelength) or less, wherewith a first point is a shortest point where light emitted from a center (C) of the active layer begins total internal reflection at an interface between the inclining surfaces of the ridge structure and air, and a second point is a point where the flat surface begins.

Here, "center (C) of the active layer" means the position on the active layer which coincides with the center of the flat surface of the ridge structure. Moreover, "shortest point where total internal reflection begins" or "shortest point of total internal reflection" means the intersection of the line from the center (C) of the active layer toward the inclining surfaces which forms an angle of $\theta_c = \sin^{-1}(1/n)$ ($\theta_c$: critical angle of total internal reflection, n: refractive index of semiconductor layer) relative to the normal direction of the inclining surfaces and the inclining surface/air interface.

In addition, "shortest length (L) from the shortest point of total internal reflection to the point where the flat surface begins" means the length from a point that is closer to the flat surface, among the two shortest points of total internal reflection existing on either side of the normal of the inclining surfaces, to the point where the flat surface begins.

Furthermore, "in-plane direction" refers to a direction that is vertical to the laminating direction (or growing direction) in accordance with the accepted practice of this technical field, and does not refer to the respective plane orientations of the plurality of crystal planes configuring the substrate.

The present invention additionally provides:

2. A semiconductor light emitting diode comprising at least a substrate having a plurality of crystal planes, a first conductivity-type barrier layer, an active layer serving as a light emitting layer and a second conductivity-type barrier layer stacked on the substrate, wherein the semiconductor light emitting diode comprises a ridge structure configured from one flat surface and at least two inclining surfaces in an in-plane direction, a width (W) of a flat surface of the ridge structure is $2\lambda$ ($\lambda$: light emission wavelength) or less, and a film with a refractive index that is smaller than a semiconductor layer of an outermost surface, which comes in contact with air, of the light emitting diode is formed on the surface of the light emitting diode so as to cover the flat surface and at least a part of the inclining surfaces of the ridge structure.

The present invention further provides:

3. The light emitting diode according to paragraph 1 above, wherein a film with a refractive index that is smaller than a semiconductor layer of an outermost surface, which comes in contact with air, of the light emitting diode is formed on the surface of the light emitting diode so as to cover the flat surface and at least a part of the inclining surfaces of the ridge structure.

The present invention further provides:

4. The light emitting diode according to paragraph 2 or paragraph 3 above, wherein the film with a small refractive index is a multi-layer film configured from a plurality of films with a different refractive index.

The present invention further provides:

5. The light emitting diode according to paragraph 4 above, wherein a refractive index of the multi-layer film configured from a plurality of films with a different refractive index gradually becomes smaller from the semiconductor side to the surface side.

The present invention further provides:

6. The light emitting diode according to any one of paragraphs 2 to 5 above, wherein the film with a small refractive index is an insulating film such as a silicon oxide film ($SiO_2$), a silicon nitride film ($SiN_x$), or aluminum oxide ($Al_2O_3$).

The present invention further provides:

7. The light emitting diode according to any one of paragraphs 2 to 5 above, wherein the film with a small refractive index is a transparent conductive film such as ITO (indium oxide-tin oxide), or zinc oxide (ZnO).

The present invention further provides:

8. The light emitting diode according to paragraph 4 or paragraph 5 above, wherein the multi-layer film is a combination of a silicon nitride film ($SiN_x$) and a silicon oxide film ($SiO_2$).

The present invention further provides:

9. The light emitting diode according to paragraph 4 or paragraph 5 above, wherein the multi-layer film is a combination of ITO (indium oxide-tin oxide) and a silicon oxide film ($SiO_2$).

The present invention further provides:

10. The light emitting diode according to paragraph 4 or paragraph 5 above, wherein the multi-layer film is a combination of zinc oxide (ZnO) and a silicon oxide film ($SiO_2$).

The present invention further provides:

11. The light emitting diode according to any one of paragraphs 1 to 10 above, wherein the flat surface of the ridge structure is a slightly inclined crystal plane that is misorientated approximately several to 10 degrees from an accurate Miller index plane.

The present invention further provides:

12. The light emitting diode according to any one of paragraphs 1 to 11 above, wherein the ridge structure is arranged in multiple arrays in the in-plane direction.

The present invention further provides:

13. The light emitting diode according to any one of paragraphs 1 to 12 above, wherein the substrate is a substrate that is configured by forming a plurality of crystal planes on a flat substrate based on a combination of lithography and etching process.

The present invention further provides:

14. The light emitting diode according to any one of paragraphs 1 to 12 above, wherein the substrate is a selectively-grown substrate formed with a plurality of different crystal planes by disposing a pattern of an insulating film on a flat substrate and subsequent selective epitaxial growth.

The present invention further provides:

15. The light emitting diode according to any one of paragraphs 1 to 14 above, wherein, when the semiconductor is such a zincblende structure semiconductor as AlGaAs and AlGaInP, a ridge flat surface having a width (W) of $2\lambda$ ($\lambda$: light emission wavelength) or less is a {001} plane.

The present invention further provides:

16. The light emitting diode according to any one of paragraphs 1 to 15 above, wherein, when the semiconductor is such a zincblende structure semiconductor as AlGaAs and AlGaInP, an inclining surface of the ridge structure is a {n11} A plane (n=1, 2, 3, 4 and 5).

The following Examples illustrate AlGaAs and GaN as examples. Since a zincblende structure semiconductor and a wurtzite structure semiconductor with the same or similar structure should have common semiconductor characteristics, it should be easy to understand that the present invention can be similarly applied to the foregoing semiconductors.

The present invention further provides:

17. The light emitting diode according to any one of paragraphs 1 to 15 above, wherein, when the semiconductor is such a zincblende structure semiconductor as AlGaAs, AlGaInP, a {111} A plane is the inclining surface and a {001} plane is the flat surface, and a crystal plane having a higher index than the {111} A plane is provided between the {111} A inclining surface and the {001} flat surface.

The present invention further provides:

18. The light emitting diode according to any one of paragraphs 1 to 14 above, wherein, when the semiconductor is a wurtzite structure semiconductor such as GaN, a ridge flat surface having a width (W) of 2λ (λ: light emission wavelength) or less is a {0001} plane.

The light emitting diode of the present invention utilizes a phenomenon where spontaneous emission of a semiconductor microstructure grown on a non-planar substrate having a plurality of crystal planes is irradiated outward with an extremely high efficiency based on the interference effect of evanescent wave.

With the light emitting diode of the present invention, it is possible to effectively inhibit the total internal reflection of light at the semiconductor/air interface, which was problematic with conventional devices, and to realize light extraction efficiency that far surpasses conventional technologies.

In addition, since the production of the light emitting diode of the present invention does not require complex production processes such as the special geometry shaping of crystals based on the mechanical method, or the formation of microcavities or a photonic crystal structure which requires sophisticated crystal growth/processing techniques, the present invention enables significantly to the cost reduction upon producing the light emitting diode.

BEST MODE FOR CARRYING OUT THE INVENTION

In the course of studying the light emitting characteristics of a semiconductor microstructure grown on a non-planar substrate having a plurality of crystal planes, the present inventors discovered a phenomenon where spontaneous emission from the microstructure is converted into air-propagating light based on an effect where evanescent wave that is generated during total internal reflection interferes with each other on a third fine crystal plane.

Figure 1:
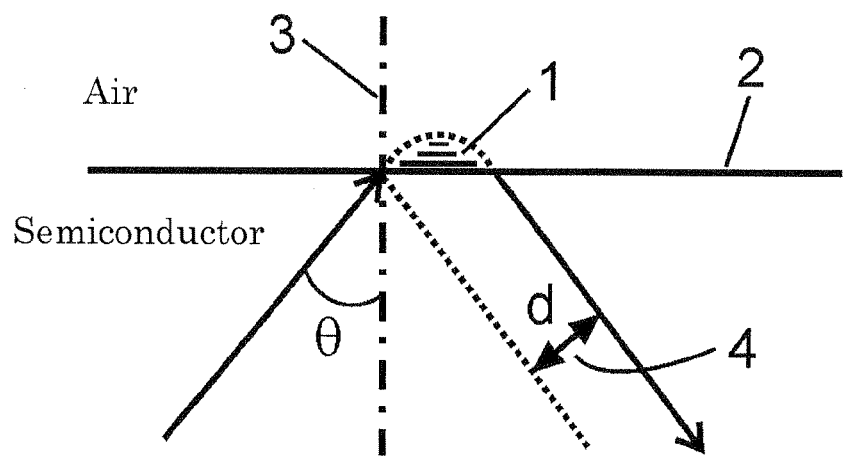
FIG. 1 is a diagram explaining the generation of evanescent wave based on total internal reflection.
Figure 2:
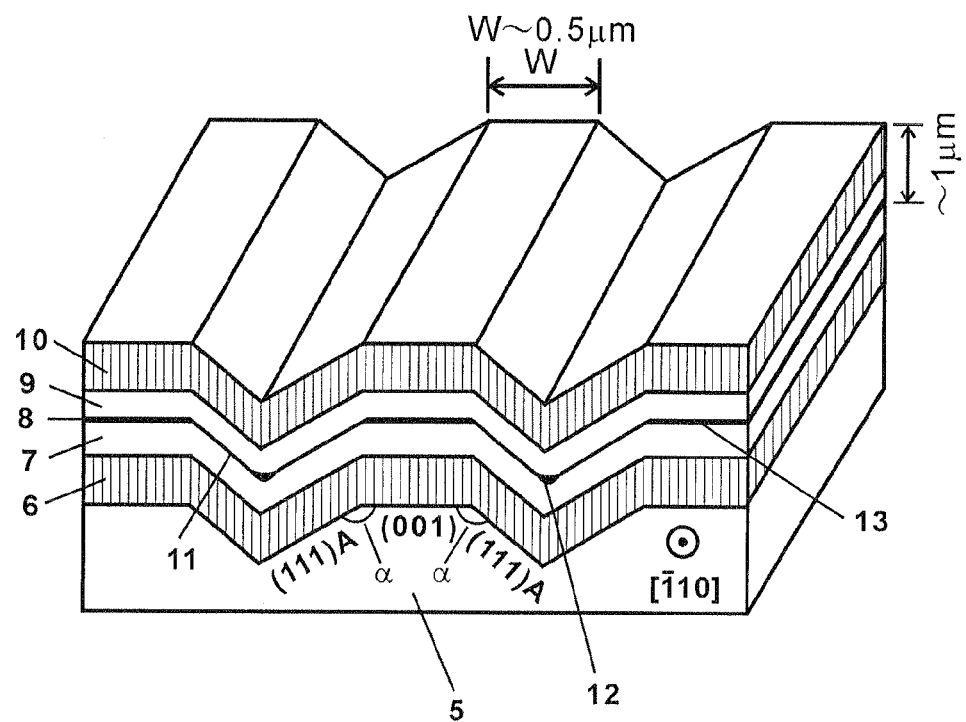
FIG. 2 is a three-dimensional schematic diagram of a sample used in observing the interference phenomenon of evanescent wave.
Figure 3:
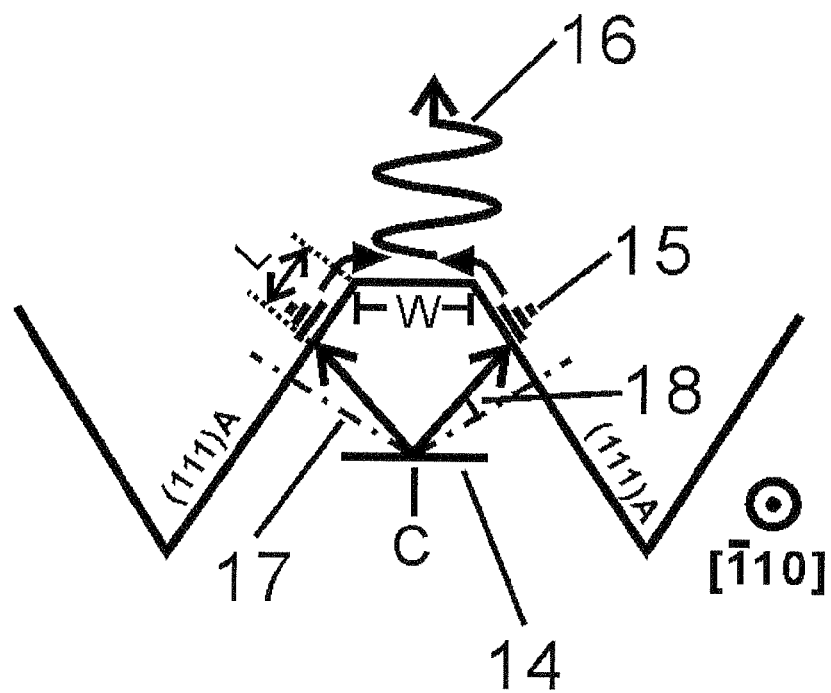
FIG. 3 is a diagram explaining the interference phenomenon of evanescent wave on a non-planar substrate.

Firstly, this phenomenon is explained in detail with FIG. 1 to FIG. 3. As shown in FIG. 1, when the light generated within the semiconductor enters the interface 2 of the semiconductor and air, if the incidence angle θ (the angle between the propagation direction of the light and the interface normal 3) becomes greater than the critical angle $\theta=\sin^{-1}(1/n)$ (n: refractive index of semiconductor layer), the so-called total internal reflection phenomenon of light in which the light does not pass through the interface of the semiconductor and air and all of it is returned into the semiconductor will occur. Pursuant to the total internal reflection, it has been known from the past that evanescent wave 1 which propagates only along the interface of the semiconductor and air and which attenuates exponentially in the vertical direction of the interface is generated. Moreover, due to the existence of the evanescent wave, the reflected light is subject to displacement referred to as the Goos-Hänchen shift 4 in the lateral direction. Since the evanescent wave is generally unable to carry energy from the semiconductor into the air, it hardly played any important role in semiconductor optical devices. The only method known to date of converting evanescent wave into air-propagating wave was to place a fine probe near the evanescent wave and to scatter the evanescent wave.

The sample of FIG. 2 is a GaAs/AlGaAs-based quantum structure grown on a V-groove GaAs substrate 5 with a V-groove pitch of 4 µm in the [110] direction, '1' hereinafter represents superscript on a numeral 1 as in FIG. 2, by using metalorganic chemical vapor deposition (MOCVD), and includes a first barrier layer 6 of $Al_{0.65}Ga_{0.35}As$ (0.75 µm), a second barrier layer 7 of $Al_{0.3}Ga_{0.7}As$ (0.25 µm), a single quantum well active layer 8 of GaAs (4 µm), a third barrier layer 9 of $Al_{0.3}Ga_{0.7}As$ (0.25 µm), and a fourth barrier layer 10 of $Al_{0.65}Ga_{0.35}As$ (0.75 µm). Here, the film thickness and Al composition both use the values of the (001) flat surface, but the Al composition of the layer grown on the (111)A plane is several percent higher than the (001) plane due to the anisotropy of the epitaxial growth, and its film thickness is roughly ½ to ⅓ of the film thickness of the (001) plane. In this sample, the ridge structure is configured from a (001) flat surface and two (111) A inclining surfaces between the V grooves, and the lateral width of the flat surface is approximately 0.5 µm. Moreover, the intersection angle (a) of the (001) flat surface and the (111) A inclining surface is approximately 130 degrees. Moreover, as shown in FIG. 2, the GaAs quantum well layer is divided into three primary structures based on the plane orientation; namely, the (001) flat surface quantum well 13, the (111) A inclining surface quantum well 11, and the crescentic quantum wire 12 formed on the V-groove bottom. The light emitting diode of the present invention has a structure in which the foregoing ridge structure is arranged in multiple arrays in the in-plane direction. The following Examples 1 to 6 also have a similar ridge structure.

Upon evaluating the light emitting characteristics of this sample with photoluminescence measurement at a low temperature (4.5 K) and room temperature, the (001) flat surface quantum well (light emission wavelength: about 750 nm at 4.5 K, about 790 nm at room temperature) shows emission intensity that was 1.6 times greater than a similar sample grown on a flat substrate even though the surface occupancy was only 12.5% (=0.5 µm/4 µm).

In addition, it was also discovered that the emission intensity (per unit area) decreases drastically as the lateral width of the (001) plane is widened, and the emission intensity becomes almost constant without depending on the lateral width when the lateral width of the (001) plane becomes 1.5 µm or more. Since it has been confirmed that the internal quantum efficiency of the foregoing sample is all 100% at least at 4.5 K, the difference in emission intensity of the photoluminescence signifies the difference in the light extraction efficiency.

As a result of quantitatively comparing the emission intensity of the sample of FIG. 2 in which the lateral width of the (001) plane is 0.5 µm and the emission intensity of samples in which the lateral width of the (001) plane is 2 µm or more, it was discovered that the emission of the (001) flat surface quantum well of the sample of FIG. 2 was irradiated into the air at an efficiency exceeding 50%. This is a light extraction efficiency that is more than twenty-fold in comparison to a similar sample grown on a flat substrate.

In addition, upon forming a $SiO_2$ film (refractive index about 1.5) having a refractive index that is smaller than GaAs and a thickness of approximately 0.15 µm on the foregoing sample surface based on the plasma CVD method, it was also discovered that the photoluminescence emission intensity increased by approximately 1.5 times in comparison to a sample without the $SiO_2$ film, and the light extraction efficiency improved to 75% or higher.

Figure 4:
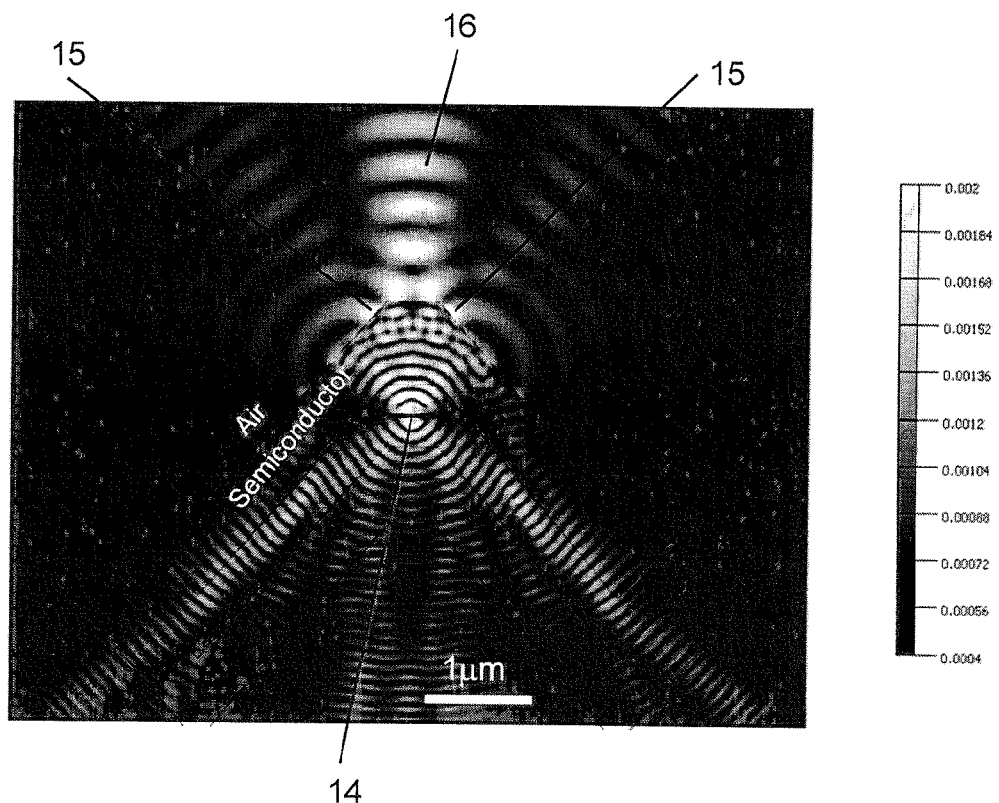
FIG. 4 is a diagram showing the electric field intensity distribution of the electromagnetic wave in the vicinity of the ridge apex of the sample of FIG. 2 calculated using the finite-difference time-domain method.

Upon calculating the electromagnetic wave intensity distribution in the vicinity of the ridge apex with the finite-difference time-domain method, it was discovered that the increase in the foregoing light extraction efficiency was a result of the interference effect of evanescent wave. In other words, as shown in FIG. 3 and FIG. 4, when the spontaneous emission generated in the quantum well light emitting layer 14 reaches the interface of the inclining surface and air at an angle equal to or greater than the critical angle for total internal reflection 18 (angle between the straight arrow and the normal of the inclining surface 17), the evanescent wave 15 is generated in the vicinity of the interface based on the total internal reflection. Note that, in theoretical analysis, the point light source positioned at the center (C) of the quantum well light emitting layer 14 was used as the luminescent light source, and a value in the vicinity of the light emission wavelength was used as the refractive index of the material. When the evanescent wave generated on the two inclining surfaces proceeds toward the ridge apex along the interface of the inclining surfaces and air and reaches the ridge apex, the two evanescent waves interfere with each other and are converted into air-propagating light 16 at an extremely high efficiency. Moreover, due to the foregoing interference of the evanescent waves, it was confirmed that the spatial distribution of the emission intensify of the sample of FIG. 2 is completely different from the Lambertian distribution of a conventional flat substrate, and is strongly localized in the vertical direction of the (001) flat surface based on both the theoretical analysis and the angle-resolved photoluminescence measurement.

Figure 5:
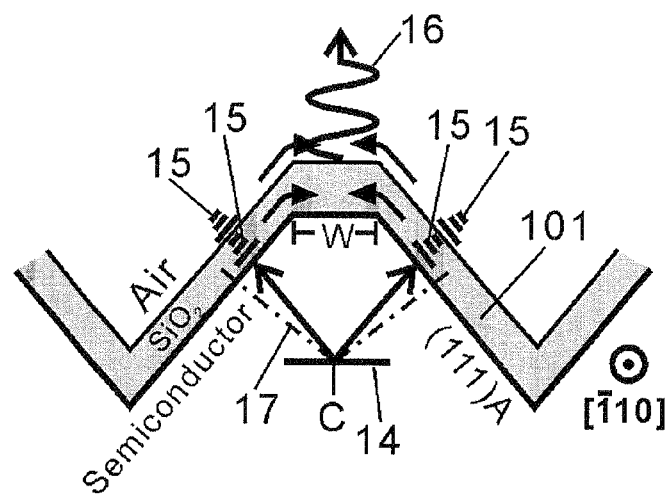
FIG. 5 is a diagram explaining the double interference phenomenon of evanescent wave in the sample in which a $SiO_2$ thin film having a refractive index that is smaller than the semiconductor layer is formed on the surface.
Figure 6:
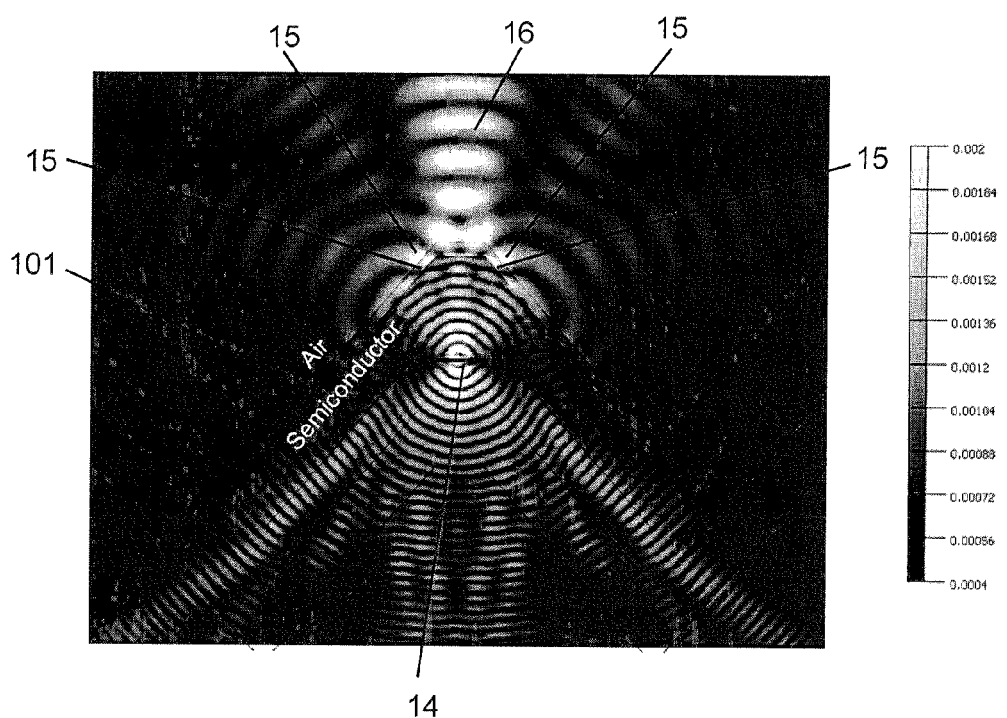
FIG. 6 is a diagram showing the electric field intensity distribution of the electromagnetic wave in the vicinity of the ridge apex of the sample, in which a $SiO_2$ thin film is formed on the surface, based on calculation using the finite-difference time-domain method.

Moreover, the electromagnetic wave intensity distribution in the vicinity of the ridge apex was also analyzed with the finite-difference time-domain method for the sample in which a $SiO_2$ film (refractive index about 1.5) of approximately 0.15 µm having a small refractive index was formed on the sample surface of FIG. 2. Thus, as shown in FIG. 5 and FIG. 6, it was discovered that evanescent wave was generated at two interfaces; namely, the interface of the semiconductor and the $SiO_2$ film 101 and the interface of the $SiO_2$ film and air. It is considered that the interference effect of the evanescent wave is thereby intensified, and the ratio of propagating light emitted into the air increases. Accordingly, it can be understood that the phenomenon of the light extraction efficiency increasing due to the $SiO_2$ film described above is caused by the double interference effect of the evanescent wave resulting from the existence of a thin film having a refractive index that is smaller than the semiconductor. As the film with a small refractive index, in addition to $SiO_2$, used may be such an insulating film as silicon nitride film ($SiN_x$), aluminum oxide ($Al_2O_3$), or such a transparent conductive film as ITO (indium oxide-tin oxide), zinc oxide (ZnO). These yield similar functions and the present invention covers these films as well. In addition, the film with a small refractive index can also be formed from a plurality of films with a different refractive index; that is, it can be formed from a multi-layer film. In particular, in the case of a multi-layer film in which the refractive index gradually becomes smaller from the semiconductor side to the surface side, the generation of evanescent wave at more than two interfaces is enabled, and the further improvement of the light extraction efficiency is possible. As an example of this type of multi-layer film, the following combinations may be considered; for example, a silicon nitride film (refractive index about 2) and a silicon oxide film (refractive index about 1.5), indium oxide-tin oxide (refractive index about 2.1) and a silicon oxide film (refractive index about 1.5), zinc oxide (refractive index about 2) and a silicon oxide film (refractive index about 1.5).

In order to efficiently generate the foregoing interference phenomenon of the evanescent wave, the geometric shape of the sample needs to satisfy several conditions. Firstly, as a result of systematically examining the ridge flat surface lateral width dependency of the emission intensity, it was discovered that the lateral width W of the ridge flat surface needs to be less than twice the light emission wavelength.

Moreover, based on the explanation of FIG. 1, the distance L from the place (intersection of the straight arrow of FIG. 3 and the inclining surface/air interface) where light emitted from the center (C) of the active layer (quantum well light emitting layer 14) in FIG. 3 begins total internal reflection at the interface between the inclining surfaces and air to the flat plane needs to be shorter than the Goos-Hänchen shift. Since the Goos-Hänchen shift is generally shorter than the light emission wavelength, to put the foregoing condition differently, the distance L from the place (intersection of the straight arrow of FIG. 3 and the inclining surface/air interface) where light emitted from the center of the active layer begins total internal reflection at the interface between the inclining surfaces and air to the ridge flat plane needs to be shorter than the light emission wavelength.

In addition, if the active layer is a multiple quantum well, it is desirable that the positional relationship of all quantum wells in the laminating direction is adjusted as described above.

Moreover, with a commercially available light emitting diode, the process of encapsulating the semiconductor chip with epoxy resin or silicon resin is generally performed for the protection of the semiconductor chip and the improvement of the light extraction efficiency. Although the refractive index (1.4 to 1.5) of the epoxy resin and silicon resin is slightly greater than air, it is considerably smaller than the semiconductor material. Accordingly, even when the semiconductor chip is encapsulated with resin, the interface where the evanescent wave is generated will be changed to the interface of the semiconductor and resin, it should be easy to understand that the present invention can be similarly applied in the foregoing case.

Figure 7:
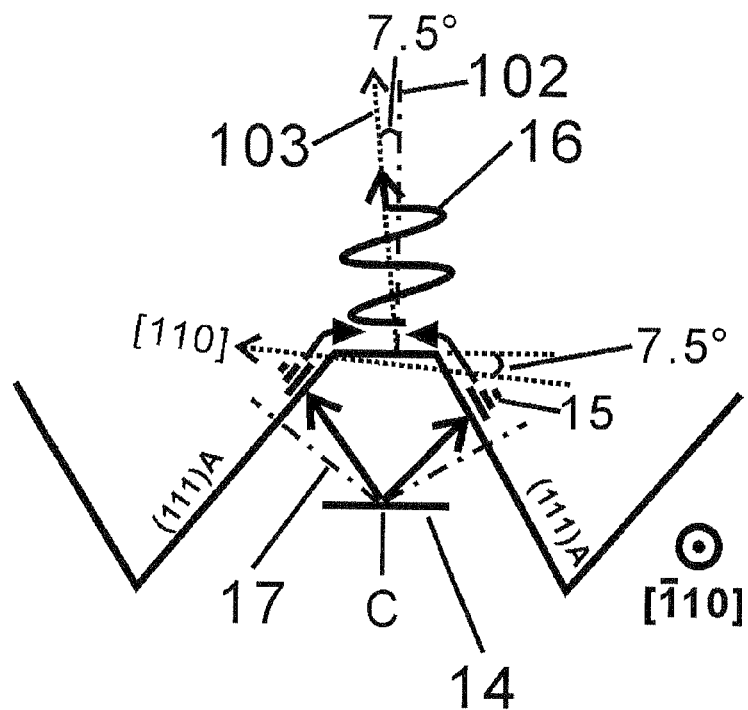
FIG. 7 is a diagram explaining the interference phenomenon of evanescent wave in the sample whose ridge flat surface is misorientated 7.5 degrees towards the [110] direction from the accurate (001) plane.
Figure 8:
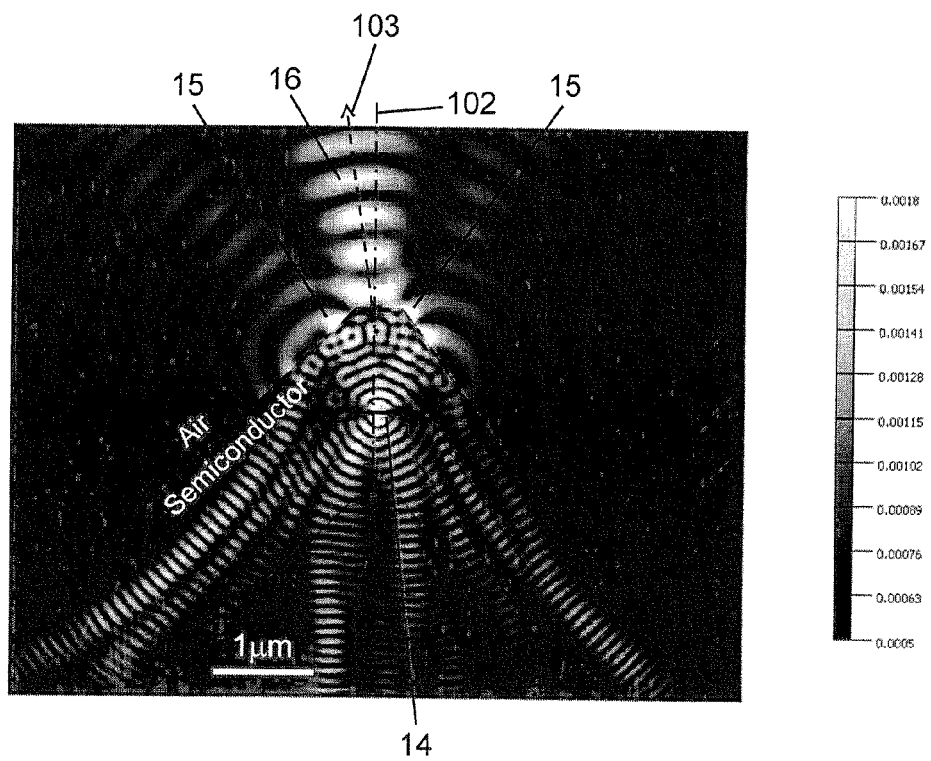
FIG. 8 is a diagram showing the electric field intensity distribution of the electromagnetic wave in the vicinity of the ridge apex of the sample, whose ridge flat surface is misorientated 7.5 degrees towards the [110] direction from the accurate (001) plane, calculated using the finite-difference time-domain method.

The interference phenomenon of evanescent wave in the case when the flat surface of the ridge structure is an accurate Miller index plane was explained above. In the foregoing case, the inclining surfaces configuring the ridge structure are generally formed symmetrically relative to the flat surface. Nevertheless, in order to control the behavior of the epitaxial growth layer, there are cases where it is desirable to grow a light emitting diode on a slightly inclined crystal plane that is misorientated approximately several to 10 degrees from an accurate Miller index plane. For example, in the case of a AlGaInP/GaAs-based red/yellow light emitting diode, generally used is a GaAs substrate that is misorientated by an angle of approximately 7.5 to 10 degrees towards the [110] direction from an accurate (001) plane in order to inhibit the wavelength shift (red shift) of the light emission wavelength caused by the self-ordering phenomenon during epitaxial growth. When the ridge structure is grown on this kind of slightly inclined substrate, the inclining surfaces of the ridge structure will be formed asymmetrically relative to the flat surface. The present invention can also be applied to the foregoing case. FIG. 7 and FIG. 8 respectively show the principle of the interference phenomenon of evanescent wave in a sample that was grown on a GaAs substrate that is misorientated 7.5 degrees towards the [110] direction from the (001) plane, and the electric field intensity distribution of the electromagnetic wave in the vicinity of the ridge apex that was analyzed by using the finite-difference time-domain method. From these two diagrams, in the foregoing case, it is evident that the irradiation direction 103 of the propagating light 16 is displaced 7.5 degrees relative to the normal direction 102 of the flat surface of the ridge structure.

EXAMPLES

Embodiments of the present invention are now explained with reference to FIG. 9 to FIG. 16.

Here, GaAs/AlGaAs is used as the material system in explaining the Examples of the present invention, but other material systems such as the AlGaInP system can also be used.

Example 1

Example 1 of the light emitting diode is now explained with reference to FIG. 9.

Figure 9:
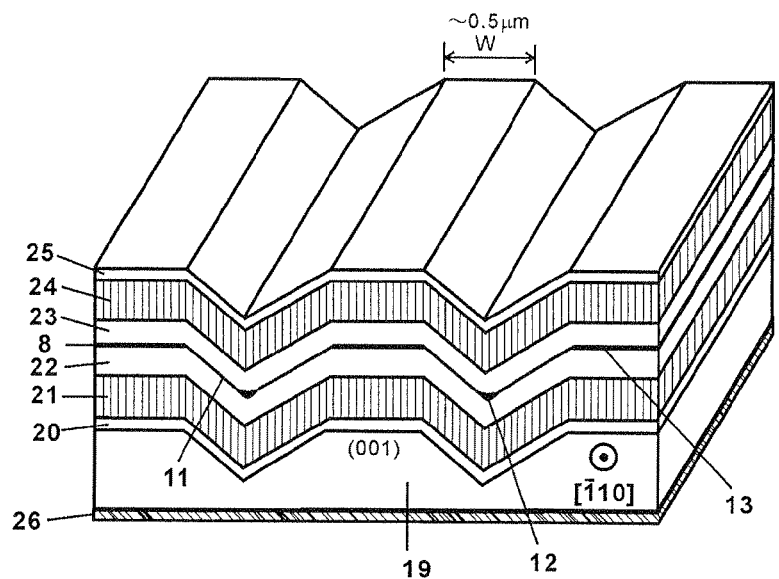
FIG. 9 is a three-dimensional schematic diagram of the semiconductor light emitting diode according to Example 1 of the present invention.

Firstly, in FIG. 9, a V-shaped groove pattern with a 4 μm pitch in the [110] direction was formed on an n-type (001) GaAs flat substrate using photolithography and wet etching. Here, as the etching solution, $NH_4OH:H_2O_2:H_2O=1:3:50$ was used and etching was performed for approximately 3 minutes at room temperature. Consequently, a V groove pattern configured from a (001) flat surface having a lateral width of approximately 0.5 μm and two (111) A inclining surfaces (there may be cases where they are misorientated by several degrees from an accurate (111) A inclining surface) was obtained.

Moreover, after forming a V groove pattern having a (001) flat surface that is wider than 0.5 μm by using the foregoing etching process, it is also possible to ultimately obtain a (001) plane having a lateral width of approximately 0.5 μm by adjusting the conditions of epitaxial growth.

Subsequently, on the V-groove GaAs substrate 19 prepared as described above, the metalorganic vapor phase epitaxy was used to sequentially grow a Si-doped n-type GaAs buffer layer 20 of 0.3 μm, a Si-doped $Al_{0.65}Ga_{0.35}As$ barrier layer (hole block layer) 21 of 0.75 μm, a Si-doped (or non-doped) $Al_{0.3}Ga_{0.7}As$ barrier layer 22 of 0.25 μm, a non-doped GaAs single or multiple quantum well active layer 8, a Zn-doped (or non-doped) $Al_{0.3}Ga_{0.7}As$ barrier layer 23 of 0.25 μm, a Zn-doped $Al_{0.65}Ga_{0.35}As$ barrier layer (electron block layer) 24 of 0.75 μm, and a Zn-doped GaAs cap layer 25 of 20 nm. Here, the values of the (001) ridge flat surface were used for both the Al composition and the film thickness of the growth layer. When growing the foregoing layers on this kind of non-planar substrate, owing to the anisotropy of crystal growth, the Al composition of the layer grown on the (111) A inclining surface is slightly higher than the (001) plane, and the Al compositions on the (111) A inclining surface of the barrier layers 21, 24 and the barrier layers 22, 23 are approximately 0.69 and 0.34, respectively. For this growth, as for the raw materials of Al, Ga and As, trimethylaluminium (TMAl), triethylgallium (TEGa) and tertiarybutylarsine (TBAs) were used. Moreover, the growth temperature was set to approximately 680° C., and the V/III ratio during the AlGaAs layer growth was set to 40 to 80.

Under the foregoing conditions, the lateral width of the (001) flat surface was basically maintained during the growth, and a structure of the (001) flat surface having a lateral width of approximately 0.5 μm was ultimately obtained. The light emission wavelength of the (001) flat surface quantum well active layer of the sample at room temperature was approximately 0.79 μm, and the distance from the place where light emitted from the center of the (001) flat surface quantum well active layer begins total internal reflection at the interface between the (111) A inclining surface and air to the flat surface was approximately 0.38 μm.

Next, although not shown in FIG. 9, a standard vacuum deposition method and liftoff technique were used to form a pattern of a Ti/Pt/Au multi-layer film or AuZn alloy film to serve as the p-type Ohmic electrode on the sample surface side. Here, the shape of the p-type Ohmic electrode may be a circle having a diameter of approximately 100 μm or a mesh structure according to the size of the device.

Subsequently, AuGe/Ni/Au was vacuum-deposited as the metal for forming the n-type Ohmic electrode on the entire back side of the sample. Finally, alloy treatment was performed to complete the formation of the p-type Ohmic electrode and the n-type Ohmic electrode 26.

Example 2

Example 2 of the light emitting diode is now explained with reference to FIG. 10.

The substrate used in this Example is a U-shaped groove substrate having two (111) A inclining surfaces and two (001) flat surfaces at the top and bottom formed on an n-type (001) GaAs flat substrate. The U-shaped substrate can be easily prepared by adjusting the etching time and the width of the photoresist pattern by using a similar etching solution as Example 1.

Subsequently, the MOCVD method was used to form a similar light emitting diode structure as Example 1 on the U-shaped groove substrate. In this structure, the GaAs quantum well active layer 8 is configured from two (111) A inclining surface quantum wells 11 and two (001) flat surface quantum wells of top 13 and bottom 27. Here, as with Example 1, the U-groove forming process and the MOCVD growth conditions are adjusted so that the final lateral width of the ridge flat surface becomes approximately 0.5 μm.

Figure 10:
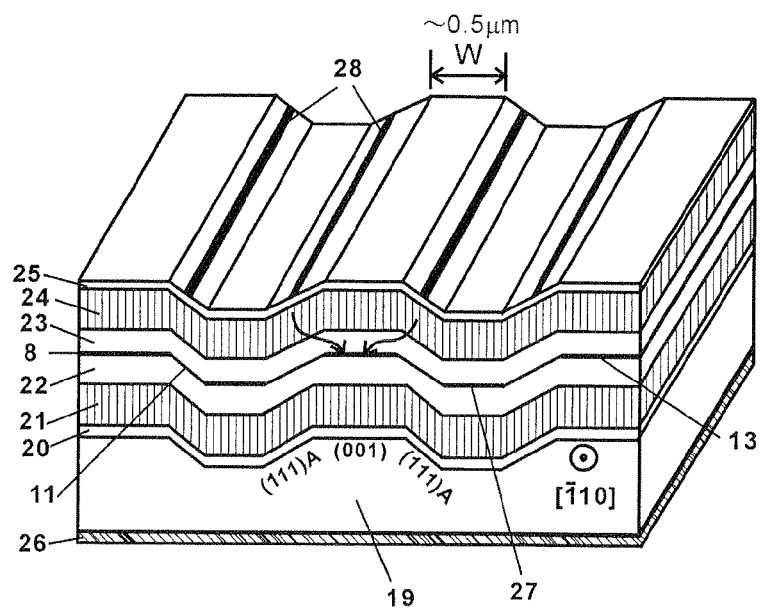
FIG. 10 is a three-dimensional schematic diagram of the semiconductor light emitting diode according to Example 2 of the present invention.

Subsequently, as shown in FIG. 10, a Ti/Pt/Au or AuZn stripe pattern 28 to serve as a p-type Ohmic electrode was selectively formed at a part of the two inclining surfaces of the ridge structure via photolithography, vacuum deposition and liftoff process. Here, as a result of selectively forming an Ohmic electrode at a part of the inclining surface, the effect of considerably inhibiting the shielding of light by the electrode can be expected.

In other words, as described above, owing to the anisotropy of crystal growth, the band gap energy of the layer grown on the (111) A inclining surface is higher than that of the layer grown on the (001) flat surface. Consequently, as shown with the arrow in FIG. 10, since most of the carrier injected from the (111) A inclining surface emits light upon foremost moving to the (001) flat surface quantum well with a low band gap energy, the current injection area and the light emitting area are substantially separated spatially. It is thereby possible to considerably inhibit the shielding of light by the electrode. Moreover, in addition to the foregoing effect, the following phenomenon also works to concentrate the carrier to the (001) flat surface quantum well. Specifically, since the Al composition of the (001) flat surface is slightly low, the turn on voltage as the diode is slightly low (roughly 0.1 V), and thus the current flows more easily to the (001) flat surface (refer to foregoing Non-Patent Document 2).

Next, based on the same process as Example 1, the vacuum deposition and alloy treatment of the back-side n-type Ohmic electrode 26 were performed to complete the formation of the Ohmic electrode. Subsequently, although not shown in FIG. 10, as the final process, a metal pattern for connecting the stripe-shaped p-type Ohmic electrode 28 in the vertical direction of the U groove and a bonding pad were formed on the sample surface.

In this device, since it is assumed that the light extraction efficiency of the bottom (001) flat surface quantum well 27 is lower than the top flat surface quantum well 13, electrical resistance of the bottom (001) flat surface part can be increased as needed by methods such as selective etching or ion implantation so as to inhibit the carrier injection to the bottom (001) flat surface quantum well 27.

Example 3

Example 3 of the light emitting diode is now explained with reference to FIG. 11 and FIG. 12.

Figure 11:
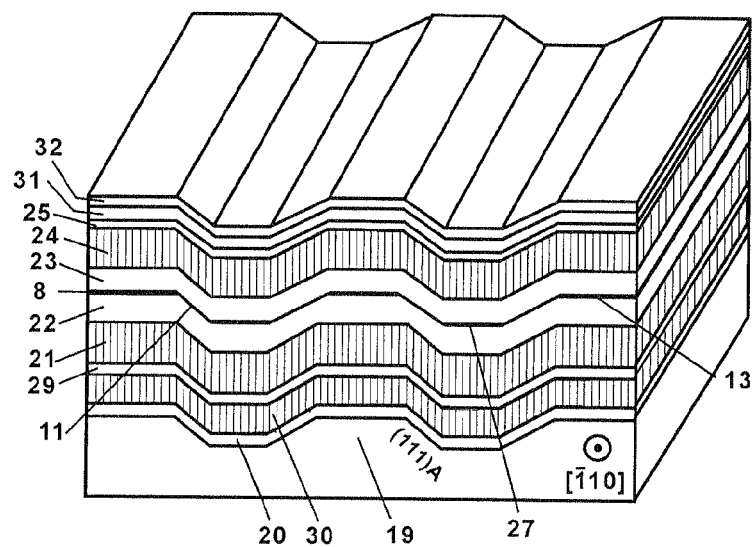
FIG. 11 is a three-dimensional schematic diagram of the semiconductor light emitting diode according to Example 3 of the present invention.

Firstly, in FIG. 11, on the U-groove GaAs substrate 19 formed with the same process as Example 2, the MOCVD method was used to sequentially grow a Si-doped GaAs buffer layer 20, a Si-doped $Al_{0.65}Ga_{0.35}As$ etching stopper layer 30 of 0.2 μm, a Si-doped GaAs etching stopper layer 29 of 50 nm, a Si-doped $Al_{0.65}Ga_{0.35}As$ barrier layer (hole block layer) 21, a Si-doped (or non-doped) $Al_{0.3}Ga_{0.7}As$ barrier layer 22, a non-doped GaAs single or multiple quantum well active layer 8, a Zn-doped (or non-doped) $Al_{0.3}Ga_{0.7}As$ barrier layer 23, a Zn-doped $Al_{0.65}Ga_{0.35}As$ barrier layer (electron block layer) 24, and a Zn-doped GaAs cap layer 25 of 20 nm.

Here, the substrate preparation process and the MOCVD growth conditions were adjusted so that the lateral width of the bottom flat surface of the GaAs etching stopper layer 29 becomes approximately 0.5 μm. Subsequently, a metal film Ag (200 nm) 31 and Au (500 nm) 32 to become the reflecting mirrors were vacuum-deposited on the entire surface. Here, the Ag film also functions as the p-type Ohmic electrode.

Figure 12:
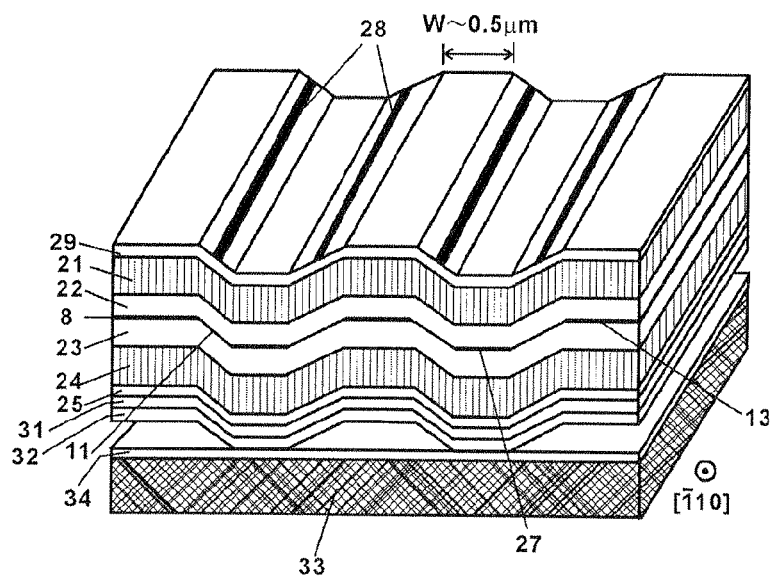
FIG. 12 is a three-dimensional schematic diagram of the semiconductor light emitting diode according to Example 3 of the present invention that was additionally processed using the sample of FIG. 11.

As shown in FIG. 12, the sample of FIG. 11 was bonded, via the eutectic bonding technique, onto the flat substrate (GaAs or Si) 33 on which the AuSn film 34 was previously evaporated to serve as the carrier of the thin film sample. Next, mechanical lapping and selective etching using a solution of citric acid:$H_2O_2$=4:1 were performed to eliminate the U groove GaAs substrate and the GaAs buffer layer 20. Thereafter, the HF solution was used to eliminate the $Al_{0.65}Ga_{0.35}As$ etching stopper layer 30, and only the thin film crystals to serve as the main body of the light emitting diode were left remaining on the flat substrate carrier 33. Finally, by using the same process as Example 2, the stripe-shaped n-type Ohmic electrode 28 and the bonding pad were formed on the Si-doped GaAs etching stopper layer 29.

In this device, since a part of the light that is not extracted by the interference effect of evanescent wave is extracted as a result of being subject to multiple reflection between the metal mirror 31 and the device/air interface, light extraction efficiency far surpassing 50% can be expected.

Example 4

Example 4 of the light emitting diode is now explained with reference to FIG. 13.

This Example relates to a device that uses a non-planar substrate that was selectively grown with an insulating film mask. Firstly, a stripe pattern 35 of an insulating film made of $SiO_2$ or the like was formed on the n-type (001) flat GaAs substrate 37 in the [110] direction.

Figure 13:
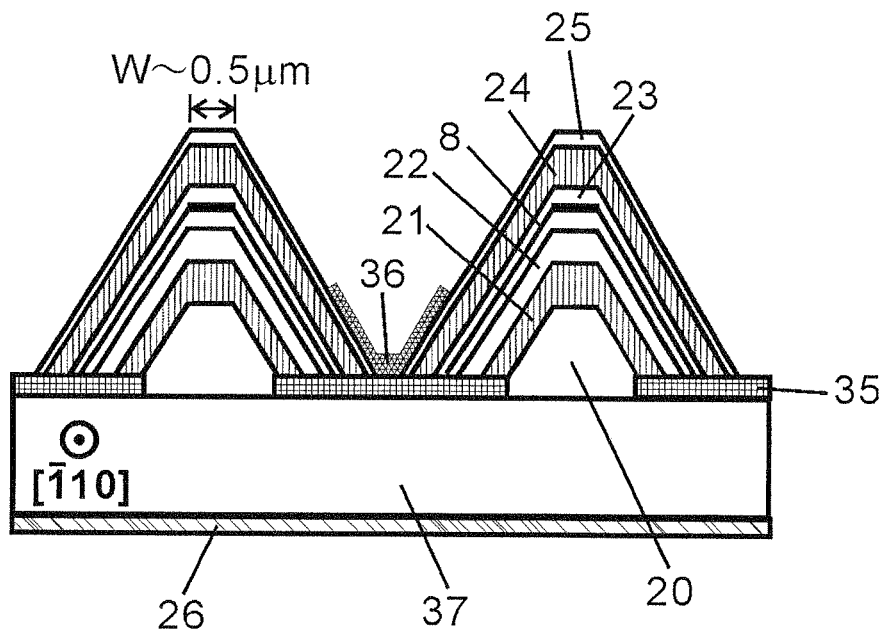
FIG. 13 is a cross-sectional schematic diagram of the semiconductor light emitting diode according to Example 4 of the present invention.

When growing the GaAs buffer layer 20 on this kind of substrate, a ridge structure having the (001) flat surface and two (111) A inclining surfaces as shown in FIG. 13 can be easily grown since the growth conditions where the crystal growth on the insulating film does not occur exist in a broad range. Here, the opening size of the insulating film pattern and the growth conditions were adjusted so that the lateral width of the (001) flat surface of the GaAs buffer layer 20 becomes approximately 0.5 µm.

On the non-planar substrate prepared with the method described above, sequentially grown were a Si-doped $Al_{0.65}Ga_{0.35}As$ barrier layer (hole block layer) 21 of 0.75 µm, a Si-doped (or non-doped) $Al_{0.3}Ga_{0.7}As$ barrier layer 22 of 0.25 µm, a non-doped GaAs single or multiple quantum well active layer 8, a Zn-doped (or non-doped) $Al_{0.3}Ga_{0.7}As$ barrier layer 23 of 0.25 µm, a Zn-doped $Al_{0.65}Ga_{0.35}As$ barrier layer (electron block layer) 24 of 0.75 µm, and a Zn-doped GaAs cap layer 25 of 20 nm.

Next, the V-shaped or U-shaped p-type Ohmic electrode 36 was formed with the liftoff process to cover a part of the inclining surface of the two ridge structure between the adjacent ridge structures on the sample surface. Finally, the n-type Ohmic electrode 26 was deposited on the entire back face This method is particularly suitable for a GaN-based device in which substrate etching is difficult.

Example 5

Example 5 of the light emitting diode is now explained with reference to FIG. 14 and FIG. 15.

This Example uses the enhancement effect of the light extraction efficiency by the film with a smaller refractive index that was formed on the surface of the outermost semiconductor layer.

Figure 14:
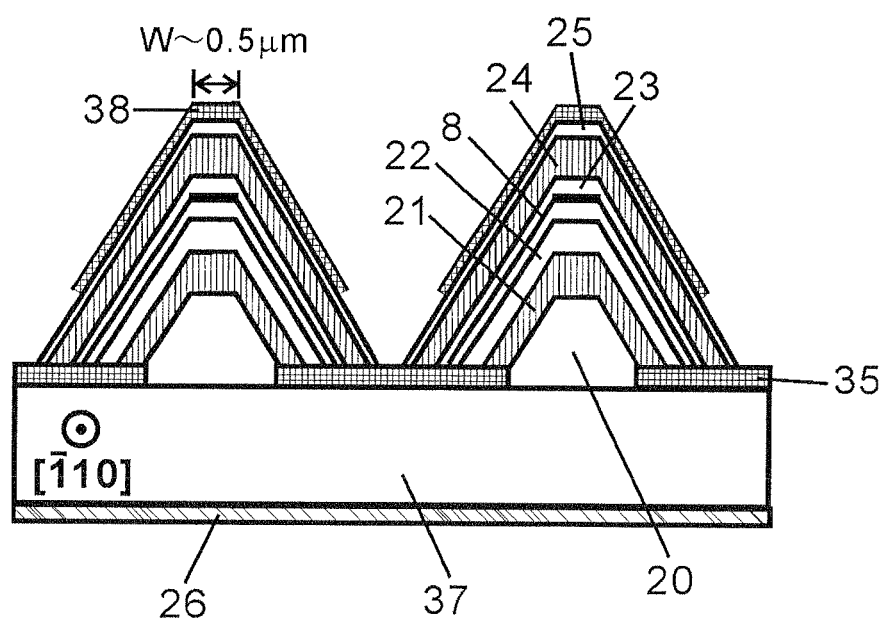
FIG. 14 is a cross-sectional schematic diagram of the semiconductor light emitting diode according to Example 5 of the present invention.

Firstly in FIG. 14, on the selectively-grown non-planar substrate prepared using the same method as Example 4, grown was the same device structure as Example 4; specifically, a Si-doped $Al_{0.65}Ga_{0.35}As$ barrier layer (hole block layer) 21 of 0.75 µm, a Si-doped (or non-doped) $Al_{0.3}Ga_{0.7}As$ barrier layer 22 of 0.25 µm, a non-doped GaAs single or multiple quantum well active layer 8, a Zn-doped (or non-doped) $Al_{0.3}Ga_{0.7}As$ barrier layer 23 of 0.25 µm, a Zn-doped $Al_{0.65}Ga_{0.35}As$ barrier layer (electron block layer) 24 of 0.75 µm, and a Zn-doped GaAs cap layer 25 of 20 nm.

Subsequently, on the foregoing sample surface, a $SiO_2$ film 38 having a refractive index of approximately 1.5 which is smaller than the refractive index of the semiconductor layer of the outermost surface; that is, the GaAs cap layer 25 was deposited with the plasma CVD method which uses TEOS $(Si(OC_2H_5)_4)$ and $O_2$ as the raw material gas. Here, the thickness of the $SiO_2$ film was set to roughly 0.15 µm. Next, based on the photolithography and wet etching (buffered hydrogen fluoride was used as the etching solution) techniques, a part of the $SiO_2$ film between the adjacent ridge structures was eliminated, and the GaAs cap layer 25 was exposed so as to cover a part of the inclining surfaces of the two ridge structures.

Figure 15:
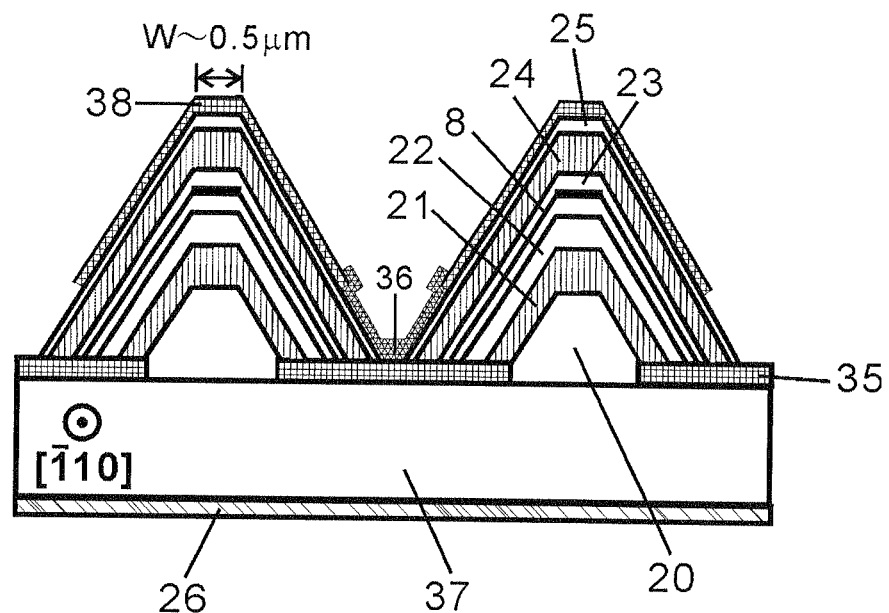
FIG. 15 is a cross-sectional schematic diagram of the semiconductor light emitting diode according to Example 5 of the present invention that was additionally processed using the sample of FIG. 14.

Thereafter, in FIG. 15, a V-shaped or U-shaped p-type Ohmic electrode 36 was formed on the exposed GaAs cap layer 25 with the liftoff process as with Example 4. Finally, deposition and alloy treatment of the n-type Ohmic electrode 26 were performed on the back side to complete the formation of the electrode.

Example 6

Figure 16:
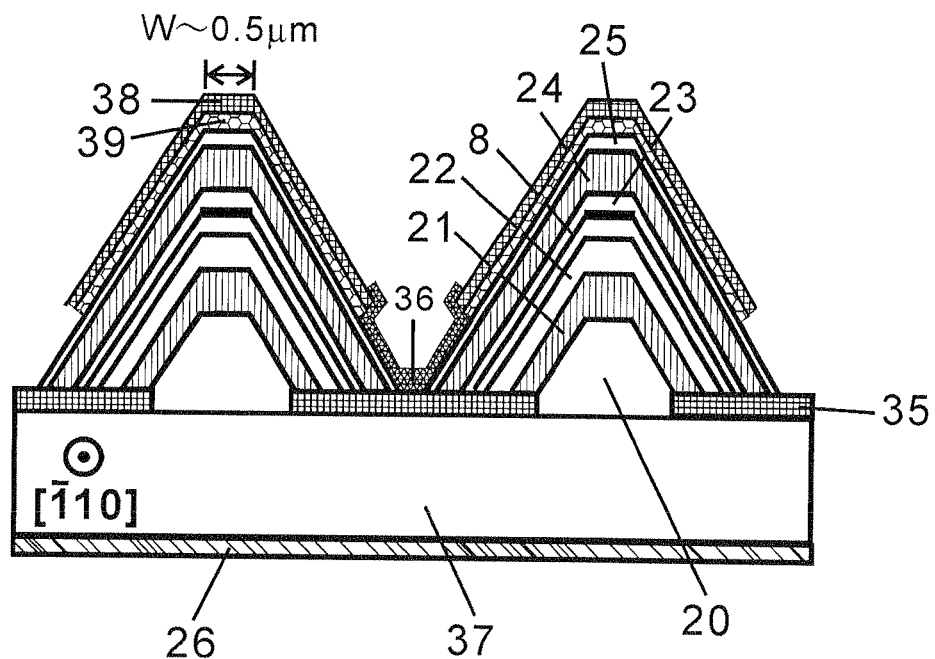
FIG. 16 is a cross-sectional schematic diagram of the semiconductor light emitting diode according to Example 6 of the present invention.

Example 6 of the light emitting diode is now explained with reference to FIG. 16. This Example is an example of the light emitting diode that utilizes the multiple interference effect of the multi-layer film formed on the surface of the outermost semiconductor layer in which its refractive index gradually becomes smaller. Foremost, with the same method as Example 5, the same device structure as Example 5 was grown on the n-type GaAs substrate 37 that is formed with the $SiO_2$ selective growth mask 35. Subsequently, on the foregoing sample surface, a silicon nitride film 39 having a refractive index of approximately 2 which is smaller than the refractive index of the semiconductor layer of the outermost surface; that is, the GaAs cap layer 25 was deposited with the plasma CVD method which uses $SiH_4$ and $NH_3$ as the raw material gas. Here, the thickness of the silicon nitride film was set to roughly 0.15 µm. And, on the foregoing sample surface, a $SiO_2$ film 38 having a refractive index of approximately 1.5 which is smaller than the refractive index of the silicon nitride film 39 was deposited with the plasma CVD method which uses TEOS $(Si(OC_2H_5)_4)$ and $O_2$ as the raw material gas. Here the thickness of the $SiO_2$ film was set to roughly 0.15 µm.

Next, as with Example 5, based on techniques of photolithography and wet etching which uses buffered hydrogen fluoride as the etching solution, a part of the $SiO_2$ film and the silicon nitride film between adjacent ridge structures was eliminated, and the GaAs cap layer 25 was exposed so as to cover a part of the inclining surfaces of the two ridge structures.

Finally, by using the same process as Example 5, the p-type Ohmic electrode 36 and the n-type Ohmic electrode 26 were formed to complete the device.

The light emitting diode of the present invention utilizes a phenomenon where spontaneous emission of a semiconductor microstructure grown on a non-planar substrate having a plurality of crystal planes is irradiated outward at an extremely high efficiency based on the interference effect of evanescent wave, and is able to effectively inhibit the total internal reflection of light at the semiconductor/air interface, which was a problem with conventional devices, and realize light extraction efficiency that far surpasses conventional technologies. Furthermore, the light emitting diode of the present invention is extremely useful in producing light emitting diodes since it does not require complex production processes such as the special geometry shaping of crystals based on the mechanical method, the formation of microcavities or a photonic crystal structure which requires sophisticated crystal growth/processing techniques, and significantly achieve the cost reduction upon producing the light emitting diode.

DESCRIPTION OF REFERENCE NUMERALS

1: evanescent wave
2: interface of semiconductor and air
3: normal of semiconductor/air interface
4: Goos-Hänchen shift
5: V-groove GaAs substrate
6: $Al_{0.65}Ga_{0.35}As$ barrier layer
7: $Al_{0.3}Ga_{0.7}As$ barrier layer
8: GaAs quantum well active layer
9: $Al_{0.3}Ga_{0.7}As$ barrier layer
10: $Al_{0.65}Ga_{0.35}As$ barrier layer
11: (111) A inclining surface quantum well
12: crescentic quantum wire formed at V-groove bottom
13: (001) flat surface quantum well
14: quantum well light emitting layer
15: evanescent wave generated by total internal reflection
16: air-propagating light
17: normal of (111) A plane
18: critical angle for total internal reflection
19: n-type V groove (or U groove) GaAs substrate
20: Si-doped n-type GaAs buffer layer
21: Si-doped n-type $Al_{0.65}Ga_{0.35}As$ barrier layer 22: Si-doped (or non-doped) $Al_{0.3}Ga_{0.7}As$ barrier layer
23: Zn-doped (or non-doped) $Al_{0.3}Ga_{0.7}As$ barrier layer
24: Zn-doped p-type $Al_{0.65}Ga_{0.35}As$ barrier layer
25: Zn doped GaAs cap layer
26: n-type Ohmic electrode
27: bottom (001) flat surface quantum well
28: stripe-shaped Ohmic electrode
29: GaAs etching stopper layer
30: $Al_{0.65}Ga_{0.35}As$ etching stopper layer
31: Ag film
32: Au film
33: flat substrate carrier (GaAs or Si)
34: AuSn deposited film
35: $SiO_2$ selective growth mask
36: V- or U-shaped Ohmic electrode
37: n-type flat (001) GaAs substrate
38: silicon oxide film ($SiO_2$)
39: silicon nitride film ($SiN_x$)
101: silicon oxide film ($SiO_2$)
102: normal direction of ridge structure flat surface
103: irradiation direction of propagating light of sample in which ridge flat surface is misoriented 7.5 degrees toward [110] direction from the accurate (001) plane

The invention claimed is:

1. A semiconductor light emitting diode, comprising:
a substrate having a ridge-shaped surface comprising a plurality of ridges, each ridge extending in an in-plane direction and consisting of a top facet and two facets inclined to the top facet, the two inclining facets being joined respectively to opposite edges of the top facet;
a first conductivity-type barrier layer stacked on the ridges of the substrate;
an active layer stacked on the first conductive-type barrier layer and serving as a light emitting layer; and
a second conductivity-type barrier layer stacked on the active layer and defining an outermost surface of the semiconductor light emitting diode which contacts atmospheric air and serves as a light-extraction surface;
wherein the active layer and first and second conductivity-type barrier layers are grown epitaxially from the ridges of the substrate and each have upper surfaces that are ridge-shaped, each ridge of each of the upper surfaces comprising a top facet and two facets inclined to the top facet, the two inclining facets being joined respectively to opposite edges of the top facet;
wherein the top facet of the light extraction surface has a width (W) of $2\lambda$ ($\lambda$: light emission wavelength) or less; and
wherein the active layer is positioned such that a center (C) of each top facet of the active layer defines a point on the inclined facet of the light-extraction surface that has a shortest distance to the center (C), the point being a location where light emitted from the center (C) of the top facet of the active layer suffers total internal reflection, and a distance (L) between the point and an edge of the top facet of the light extraction surface is $\lambda$ or less.

2. The light emitting diode according to claim 1, further comprising a film having a refractive index smaller than that of the outermost surface of the second conductivity-type barrier layer formed over the outermost surface of the second conductivity-type barrier layer so as to cover the top facets of the second conductivity-type barrier layer and at least a part of the inclining facets of the second conductivity-type barrier layer.

3. The light emitting diode according to claim 1, wherein the top facet of each ridge of the substrate has a crystal plane that is misorientated by an angle of approximately 7.5 to 10 degrees from an accurate Miller index plane.

4. The light emitting diode according to claim 1, wherein the plurality of ridges of the substrate are arranged in multiple arrays in the in-plane direction.

5. The light emitting diode according to claim 1, wherein the substrate is configured by forming a plurality of crystal planes on a flat substrate based on a combination of lithography and etching processes.

6. The light emitting diode according to claim 1, wherein the substrate is a selectively-grown substrate formed with a plurality of different crystal planes by disposing a pattern of an insulating film on a flat substrate and subsequent selective epitaxial growth.

7. The light emitting diode according to claim 1, wherein a semiconductor material of the first conductivity-type barrier layer and the second conductivity-type barrier layer is selected from the group consisting of a zincblende structure semiconductor, AlGaAs, and AlGaInP, and wherein the top facet of each ridge of the substrate is a {001} plane.

8. The light emitting diode according to claim 1, wherein a semiconductor material of the first conductivity-type barrier layer and the second conductivity-type barrier layer is selected from the group consisting of a zincblende structure semiconductor, AlGaAs, and AlGaInP, and wherein the inclining facets of each ridge of the substrate are a {n11} A plane (n=2 1, 2, 3, 4 and 5).

9. The light emitting diode according to claim 1, wherein a semiconductor material of the first conductivity-type barrier layer, the active layer, and the second conductivity-type barrier layer is a wurtzite structure semiconductor or GaN, and wherein the top facet of each ridge of the substrate is a {0001} plane.

10. The light emitting diode according to claim 1, wherein the width (W) of the top facet of the light extraction surface is 0.5 to 1.5 µm.

11. The light emitting diode according to claim 10, wherein the width (W) of the top facet of the light extraction surface is 0.5µm.

12. A semiconductor light emitting diode, comprising:
a substrate having a ridge-shaped surface comprising a plurality of ridges, each ridge extending in an in-plane direction and each consisting of a top facet and two facets inclined to the top facet, the two inclining facets being joined respectively to opposite edges of the top facet;
a first conductivity-type barrier layer stacked on the ridges of the substrate;
an active layer stacked on the first conductive-type barrier layer and serving as a light emitting layer; and
a second conductivity-type barrier layer stacked on the active layer;
wherein the active layer and first and second conductivity-type barrier layers are grown epitaxially from the ridges of the substrate and each have upper surfaces that are ridge-shaped, each ridge of each of the upper surfaces comprising a top facet and two facets inclined to the top facet, the two inclining facets being joined respectively to opposite edges of the top facet;
wherein a film having a refractive index smaller than that of an outermost surface of the second conductivity-type barrier layer fomied over the second conductivity-type barrier layer so as to cover each top facet of the second conductivity-type barrier layer and at least a part of the inclined facets of the second conductivity-type barrier layer, such that the film contacts atmospheric air and serves as a light-extraction surface of the semiconductor light emitting diode and such that the light extraction surface includes a top facet having a width (W) of 2λ (λ: light emission wavelength) or less.

13. The light emitting diode according to claim 12, wherein the film having a refractive index smaller than that of the outermost surface of the second conductivity-type barrier layer is selected from the group consisting of an insulating film, a silicon oxide film ($SiO_2$), a silicon nitride film ($SiN_x$), and aluminum oxide ($Al_2O_3$).

14. The light emitting diode according to claim 12, wherein the film having a refractive index smaller than that of the outermost surface of the second conductivity-type barrier layer is selected from the group consisting of a transparent conductive film, ITO, and zinc oxide (ZnO).

15. The light emitting diode according to claim 12, wherein the film having a refractive index smaller than that of the outermost surface of the second conductivity-type barrier layer comprises a multi-layer film configured from a plurality of films, each of the plurality of films having a different refractive index relative to other ones of the plurality of films of the multi-layer film.

16. The light emitting diode according to claim 15, wherein the multi-layer film is a combination of a silicon nitride film ($SiN_g$) and a silicon oxide film ($SiO_2$).

17. The light emitting diode according to claim 15, wherein the multi-layer film is a combination of ITO (indium oxide-tin oxide) and a silicon oxide film ($SiO_2$).

18. The light emitting diode according to claim 15, wherein the multi-layer film is a combination of zinc oxide (ZnO) and a silicon oxide film ($SiO_2$).

19. The light emitting diode according to claim 15, wherein one of the plurality of films positioned closest to the second conductivity-type barrier layer has a larger refractive index than that of one of the plurality of films positioned remote from the second conductivity-type barrier layer so that the refractive index of the multi-layer film gradually decreases in an outward direction from the second conductivity-type barrier layer.

20. The light emitting diode according to claim 12, wherein the width (W) of the top facet of the light extraction surface is 0.5 to 1.5 μm.

* * * * *

UNITED STATES PATENT AND TRADEMARK OFFICE
CERTIFICATE OF CORRECTION

PATENT NO. : 8,659,039 B2  Page 1 of 1
APPLICATION NO. : 13/146179
DATED : February 25, 2014
INVENTOR(S) : Xuelun Wang et al.

It is certified that error appears in the above-identified patent and that said Letters Patent is hereby corrected as shown below:

In the Claims:

Column 16, claim 12, line 62 "fomied" should read "formed"

Signed and Sealed this
Twentieth Day of May, 2014

Michelle K. Lee
*Deputy Director of the United States Patent and Trademark Office*